(12) United States Patent
Yamaha et al.

(10) Patent No.: US 6,251,805 B1
(45) Date of Patent: Jun. 26, 2001

(54) METHOD OF FABRICATING SEMICONDUCTOR DEVICE

(75) Inventors: Takahisa Yamaha; Yushi Inoue, both of Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 08/993,681

(22) Filed: Dec. 18, 1997

(30) Foreign Application Priority Data

Dec. 24, 1996 (JP) .................................................. 8-355582

(51) Int. Cl.$^7$ ...................................................... H01L 21/31
(52) U.S. Cl. ........................... 438/782; 438/624; 427/387
(58) Field of Search ................................... 438/618, 624, 438/787, 782, 909, 781; 427/96, 372.2, 377, 387

(56) References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,085,893 | 2/1992 | Weiss et al. | 427/387 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,370,904 | 12/1994 | Mine et al. | 427/515 |
| 5,380,567 | 1/1995 | Haluska | 427/578 |
| 5,399,441 | 3/1995 | Bearinger et al. | 428/689 |
| 5,458,912 | 10/1995 | Camilletti et al. | 427/126.4 |
| 5,506,177 | 4/1996 | Kishimoto et al. | 437/195 |
| 5,750,403 | * 5/1998 | Inoue et al. | 438/787 |

FOREIGN PATENT DOCUMENTS

| | | |
|---|---|---|
| 6-181204 | 6/1994 | (JP) . |
| 6-181203 | * 6/1994 | (JP) . |
| 07211664 | * 8/1995 | (JP) . |

OTHER PUBLICATIONS

Pernisz, U>C> "Electronic conduction of non–dense silica thin films", ElectroceramicsIV vol. 2, p. 823–6, Sep., 1994.*
B.T. Ahlburn, et al., "A Non–Etch Back Spin on Glass for 0.5µM Devices Using Hydrogen Silsesquioxane as A Replacement for Methylsiloxane", Jun. 7–8, 1994, VMIC Conference, 1994, ISMIC, pp. 120–122.
B.T. Ahlburn, et al., "Hydrogen Silsesquioxane–Based Flowable Oxide as an Element in the Interlevel Dielectric for Sub 0.5 Micron ULSI Circuits", Feb. 21–22, 1995, VMIC Conference, 1995 ISMIC, pp. 36–42.
D. Pramanik, et al., "Reliability of Multilevel Circuits Using Hydrogen Silsesquioxane $FO_x$ for Interlevel Dielectric Planarization", Jun. 8–9, 1993, VMIC Conference, 1993 ISMIC, pp. 329–331.
Brochure of Flowable Oxide by Dow Corning Corporation (1993), pp. 1–4.
R. Dawson, et al., "Performance of Logic Devices Utilizing A Novel Spin–On Dielectric Planarization Process", Jun. 8–9, 1993, VMIC Conference, 1993 ISMIC, p. 218.
D.S. Ballance, et al., "Low Temperature Reflow Planarization Using A Novel Spin–On Interlevel Dielectric", Jun. 9–10, 1992, VMIC Conference, 1992 ISMIC, pp. 180–186.

* cited by examiner

Primary Examiner—Caridad Everhart
(74) Attorney, Agent, or Firm—Ostrolenk, Faber, Gerb & Soffen, LLP

(57) ABSTRACT

A hydrogen silsesquloxane resin film is formed flat by spin-coating or another such method on the surface of a semiconductor substrate or another such treatment wafer 38, after which the above-mentioned resin film is subjected to a heat treatment in an inert gas atmosphere to form a silicon oxide film of preceramic phase. In a hot plate type of heating apparatus, the wafer 38 is placed on a conveyor belt 34 and moved above a heat-generating block 30, which heats the wafer in the open air and converts the preceramic-phase silicon oxide film into a ceramic-phase silicon oxide film. The silane generated during heating does not adhere to the wafer surface as $SiO_2$ particles, so no microscopic protrusions are produced. $N_2$ or another such inert gas may be blown at the wafer 38 during heating.

34 Claims, 11 Drawing Sheets

METHOD OF FABRICATING SEMICONDUCTOR DEVICE

This application is based on Japanese Patent Application No. 8-355,582, filed on Dec. 24, 1996, the entire contents of which are incorporated herein by reference.

BACKGROUND OF THE INVENTION a). Field of the Invention

The present invention relates to a method of fabricating a semiconductor device, and more particularly relates to a method for forming a silicon oxide film that is suitable for use as an interlayer insulating film, passivation film, protective film, or other insulation film in a semiconductor device using a hydrogen silsesquioxane resin film.

b). Description of the Related Art

The use of a hydrogen silsesquioxane resin film to form an interlayer insulating film in a multilevel wiring structure was known in the past (see, for example, Japanese Laid-Open Patent Application JP-A 6-181204).

With an interlayer insulating film formation method such as this, the first step is to form a hydrogen silsesquioxane resin film on the surface of a semiconductor device by spin-coating or another method. The resin film is subjected to a heat treatment in an $N_2$ or other inert gas atmosphere to produce a silicon oxide film in a preceramic phase, and this silicon oxide film is then subjected to another heat treatment in an $O_2$ gas or other oxidizing atmosphere to convert the preceramic silicon oxide film into a ceramic-phase silicon oxide film. The silicon oxide in preceramic phase referred to here is a precursor of ceramic-phase silicon oxide, in which crosslinking is not as advanced as in ceramic-phase silicon oxide, but which is insoluble in organic solvents.

This method allows a silicon oxide film to be obtained with a thickness of at least 1 $\mu$m and without any cracks. This silicon oxide film is useful as an interlayer insulating film.

Research conducted by the inventors has revealed that the prior art discussed above leads to a lower yield in wiring formation because microscopic protrusions about 0.1 $\mu$m in diameter are produced on the surface of the ceramic-phase silicon oxide film.

FIGS. 11 through 15 illustrate a multilevel wiring formation method in which this prior art is applied.

In the step in FIG. 11, a wiring layer 14 is formed on a silicon oxide or other such insulation film 12 that covers the surface of a semiconductor substrate 10, after which an insulation film 16 composed of silicon oxide is formed by plasma enhanced CVD (Chemical Vapor Deposition) so as to cover the insulation film 12 and wiring layer 14. Hydrogen silsesquioxane resin is dissolved in methyl isobutyl ketone (MIBK), and the resulting solution is applied to the top surface of the substrate by spin-coating, which forms a hydrogen silsesquioxane resin film 18A on the insulation film 16 such that the former has a flat surface.

In the step in FIG. 12, the hydrogen silsesquloxane resin film 18A is subjected to a heat treatment in an inert gas atmosphere, which converts the hydrogen silsesquioxane resin film 18A into a pre-ceramic-phase silicon oxide film 18. The silicon oxide film 18 is then subjected to another heat treatment in a mixed atmosphere of $O_2$ gas an an inert gas, which converts the silicon oxide film 18 into a ceramic-phase silicon oxide film. The heat treatments performed here to produce a ceramic were conducted using a vertical heat treatment furnace as shown in FIG. 18. These heat treatments will be described in detail below. It was found that as a result of these heat treatments, microscopic protrusions 18a with a diameter of about 0.1 $\mu$m were produced on the surface of the ceramic-phase silicon oxide film 18.

In the step in FIG. 13, a conformal insulation film 20 composed of silicon oxide is formed by plasma enhanced CVD so as to cover the ceramic-phase silicon oxide film 18. At this point, convex components 20a that faithfully reflect the microscopic protrusions 18a of the silicon oxide film 18 are formed on the insulation film 20.

One problem related to the microscopic protrusions 18a and convex components 20a formed in this manner is that the shape of the connecting holes deteriorates as shown in FIGS. 14 and 15.

In the step in FIG. 14, a resist layer 22 having holes corresponding to the desired connecting holes is formed over the insulation film 20, after which shallow connecting holes 24a are formed by selective wet etching (isotropic etching) in which the resist layer 22 serves as a mask. The connecting holes 24a serve to enhance the step coverage of the wiring by moderating the steps at the opening edges of deep connecting holes 24b shown in FIG. 15.

If a 10:1 mixture of an $NH_4F$ aqueous solution and HF, for example, is used as the etching solution in the wet etching treatment shown in FIG. 14, then the etching solution will penetrate the microscopic protrusions 18a and nearby locations Q (locations that are shown by cross hatching) via the convex components 20a since the film is less dense at the convex components 20a and the wet etching is faster there.

Next, in the step in FIG. 15, connecting holes 24b that extend from the connecting holes 24a to the wiring layer 14 are formed by selective dry etching (anisotropic etching) in which the resist layer 22 serves as a mask. This etches away the microscopic protrusions 18a and the nearby dissolved locations Q, so concave components R are produced on the side walls of the connecting holes 24b.

After the removal of the resist layer 22, a wiring material is applied to the upper surface of the substrate to create a pattern, which forms a wiring layer (not shown) that extends to the wiring layer 14 via the connecting holes 24 and 24b. The wiring layer formed here has poor coverage at the places corresponding to the concave components R of the connecting holes 24b, so reliability suffers.

Another problem related to the microscopic protrusions and convex components is that short circuiting occurs between the wiring layers near convex components 20b corresponding to microscopic protrusions 18b, as shown in FIGS. 16 and 17. The microscopic protrusions 18b and convex components 20b are formed in the same manner as the above-mentioned microscopic protrusions 18a and convex components 20a, respectively.

After the step in FIG. 13, when the wiring material is applied to the upper surface of the substrate, and this application layer is patterned by selective etching to form a wiring layer, if the adjacent wiring layers 26A and 26B are formed in a shape that surrounds the convex components 20b as shown in FIGS. 16 and 17, part of the wiring material at the periphery of the convex components 20b will remain as etching residue 28. The etching residue 28 puts the wiring layers 26A and 26B in a short-circuited state.

FIG. 18 illustrates the vertical heat treatment furnace used in the ceramic conversion step in FIG. 12. A plurality of heaters, such as 3A to 3C, are wound around the outside of a process pipe 1 composed of quartz or the like via a soaking pipe 2 which uniformalizes the incoming heat.

A lid member 4, which is shown at the bottom in the figure, has a cylindrical member 5, and supports a wafer holder 6. A plurality of wafer support rods $B_1$, $B_2$, and so on are provided on the wafer holder 6 in an assembled state such that they are perpendicular to a plurality of linking members $K_1$ to $K_4$. The plurality of wafer support rods are structured such that they are able to support 50 wafers WF in 50 groups of wafer support grooves made on the inner sides.

After the desired number of wafers WF have been loaded into the wafer holder 6, the wafer holder 6 is inserted into the process pipe 1 in a state in which it is supported by the lid member 4. The opening at the lower end of the process pipe 1 is closed by the lid member 4 and the cylindrical member 5 as shown in FIG. 18.

A gas introduction pipe 1a is provided to the upper portion of the process pipe 1, and the feed gas $G_1$ introduced into the process pipe 1 via the gas introduction pipe 1a is fed to the wafer WF side via a flow regulator plate 7. An exhaust pipe 1b is provided to the lower portion of the process pipe 1, and the exhaust gas $G_2$ is guided out via the exhaust pipe 1b. A maximum of 20 L/min of gas can flow through the furnace in FIG. 18.

With the ceramic conversion process in FIG. 18, a heat treatment was conducted in a state in which 50 wafers WF had been inserted into the furnace shown in FIG. 18. The heat treatment conditions here were such that the temperature was 400° C., the duration was 60 minutes, and the feed gas was $O_2$ plus $N_2$ ($N_2$ flux of 5.0 L/min).

SUMMARY OF THE INVENTION

An object of the present invention is to provide a novel wiring structure formation method with which the production of microscopic protrusions can be prevented.

According to one aspect of this invention, there is provided a method of fabricating a wiring structure comprising the steps of: a) providing a substrate having conductive regions and an overlying structure thereon; b) forming a hydrogen silsesquioxane resin film over the substrate; c) subjecting the hydrogen silsesquioxane resin film to a first heat treatment in an inert gas atmosphere to convert the hydrogen silsesquioxane resin film into a silicon oxide film in a preceramic phase; and d) subjecting the silicon oxide film to a second heat treatment in an ambient which is open to external atmosphere to convert the silicon oxide film of the preceramic phase to a silicon oxide of a ceramic phase.

Since air is used as the oxidative or oxidizing atmosphere, and the substrate is heated in a heating space through which the external atmosphere can freely pass, the $SiO_2$ particles produced by reaction between the $O_2$ in the air and the $SiH_4$ (silane) generated from the silicon oxide film during heating are efficiently eliminated from the substrate and the nearby areas. Therefore, the second heat treatment can be carried out in a state in which no $SiO_2$ particles are adhered to the the silicon oxide film, and the production of microscopic protrusions on the surface of the silicon oxide film can be prevented.

If the heat treatment for converting a preceramic-phase silicon oxide film into a ceramic-phase silicon oxide film is carried out in a heating space in which the air can freely pass, the $SiO_2$ particles produced by reaction between the oxygen in the air and the silane generated from the silicon oxide film will not adhere to the silicon oxide film. This prevents the production of microscopic protrusions on the surface of the ceramic-phase silicon oxide film. Therefore, when the silicon oxide film is used as an interlayer insulating film or protective film in a semiconductor device, good flatness will be obtained, and deterioration of the connecting hole shape, short-circuiting of the wiring, and other such problems can be prevented.

Also, the adherence of $SiO_2$ particles to the silicon oxide film can be prevented even more effectively if an inert gas is blown at the wafers during the heat treatment performed to effect ceramic conversion.

Furthermore, there will be an increase in throughput if the heating is carried out while a plurality of wafers are successively moved through a heating space during the heat treatment performed to effect ceramic conversion.

Since the method described above does not make use of a furnace as shown in FIG. 18, the problems encountered when a furnace is used can be avoided.

DESCRIPTION OF THE PREFERRED EMBODIMENTS

Figure 12:
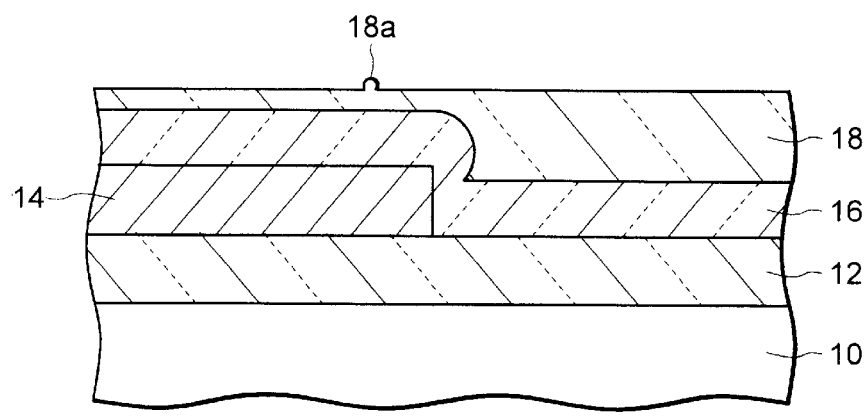
FIG. 12 is a cross section of the substrate illustrating the preceramic conversion and ceramic conversion steps following the step in FIG. 11.
Figure 13:
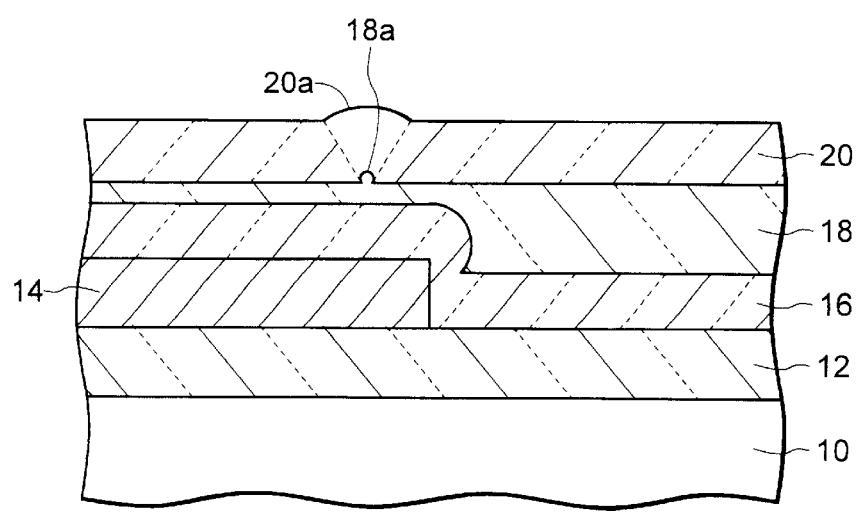
FIG. 13 is a cross section of the substrate illustrating the insulation film formation step following the step in FIG. 12.
Figure 14:
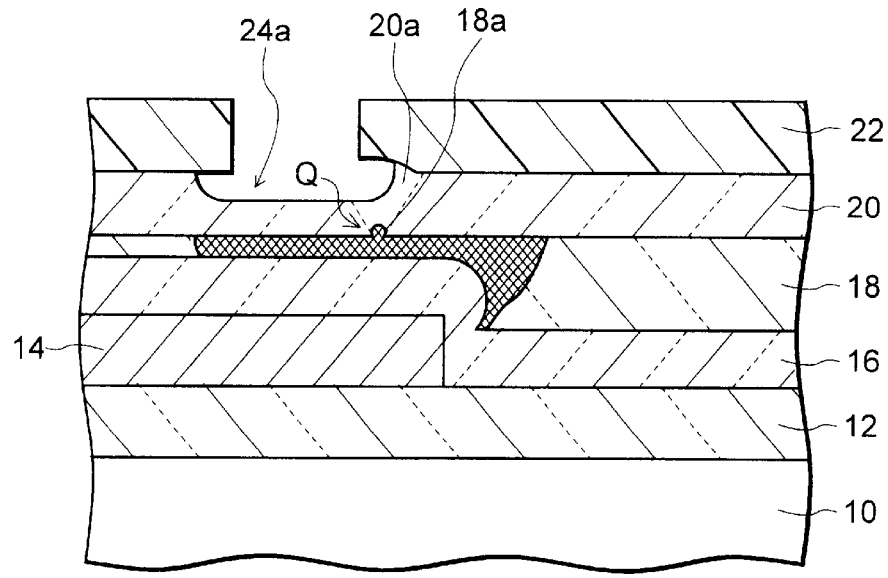
FIG. 14 is a cross section of the substrate illustrating the wet etching step following the step in FIG. 13.
Figure 15:
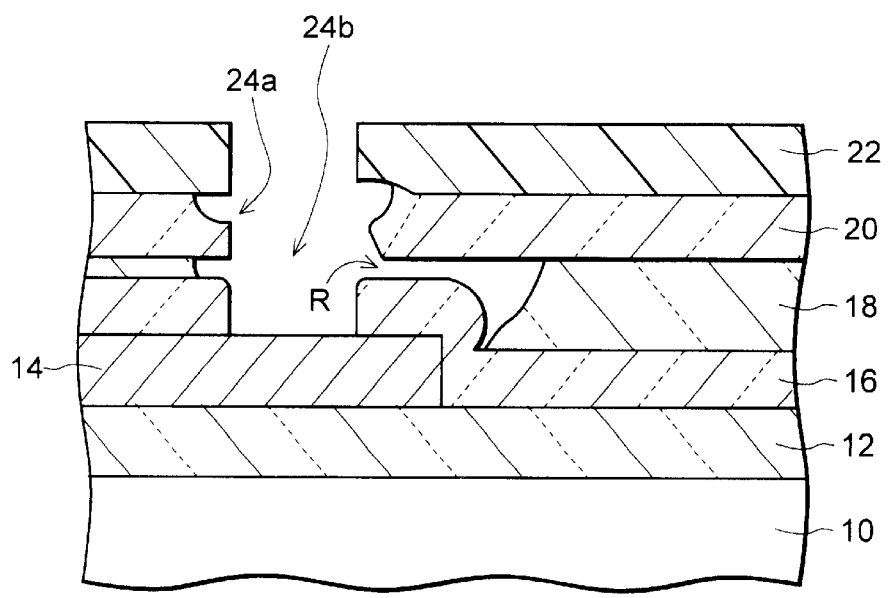
FIG. 15 is a cross section of the substrate illustrating the dry etching step following the step in FIG. 14.

The inventors, in the belief that the production of microscopic protrusions such as 18a in FIG. 12 should be prevented in order to eliminate the problems mentioned above in relation to FIGS. 14 through 17, conducted literature searches and research aimed at finding the mechanism by which these microscopic protrusions are produced. As a result, it was discovered that no fundamental resolution can be achieved as long as a furnace is used for the heat treatment conducted for ceramic conversion.

Figure 18:
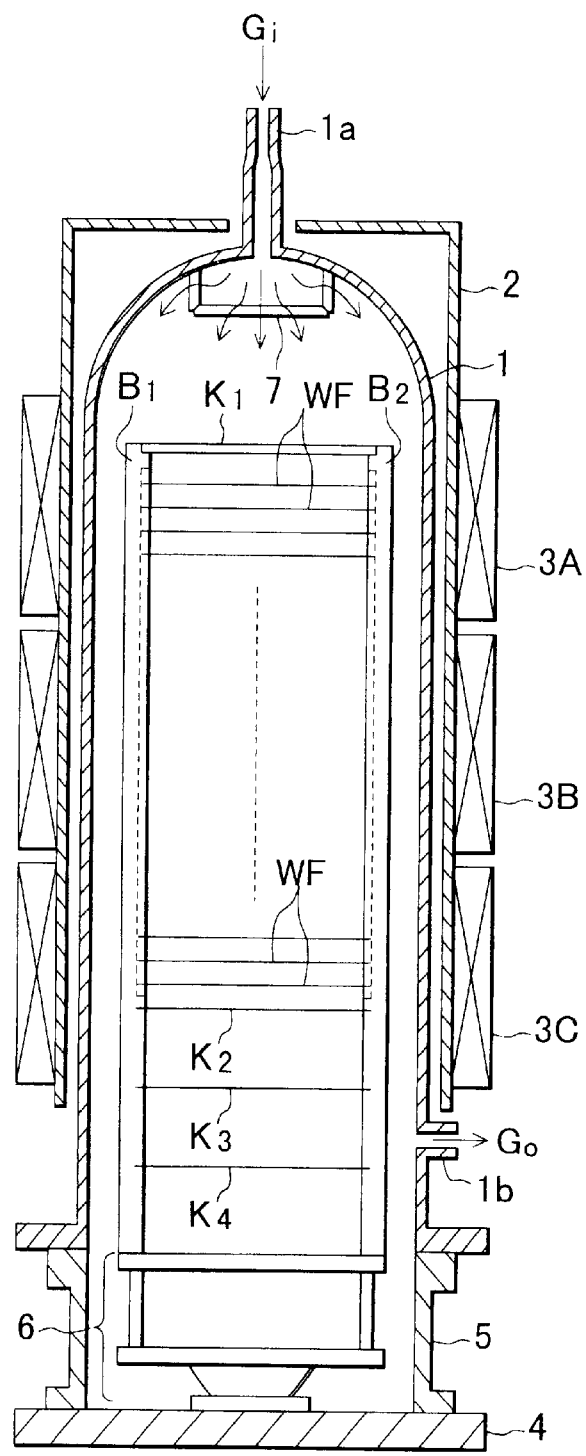
FIG. 18 is a cross section illustrating a vertical heat treatment furnace used in prior art.
Figure 19:
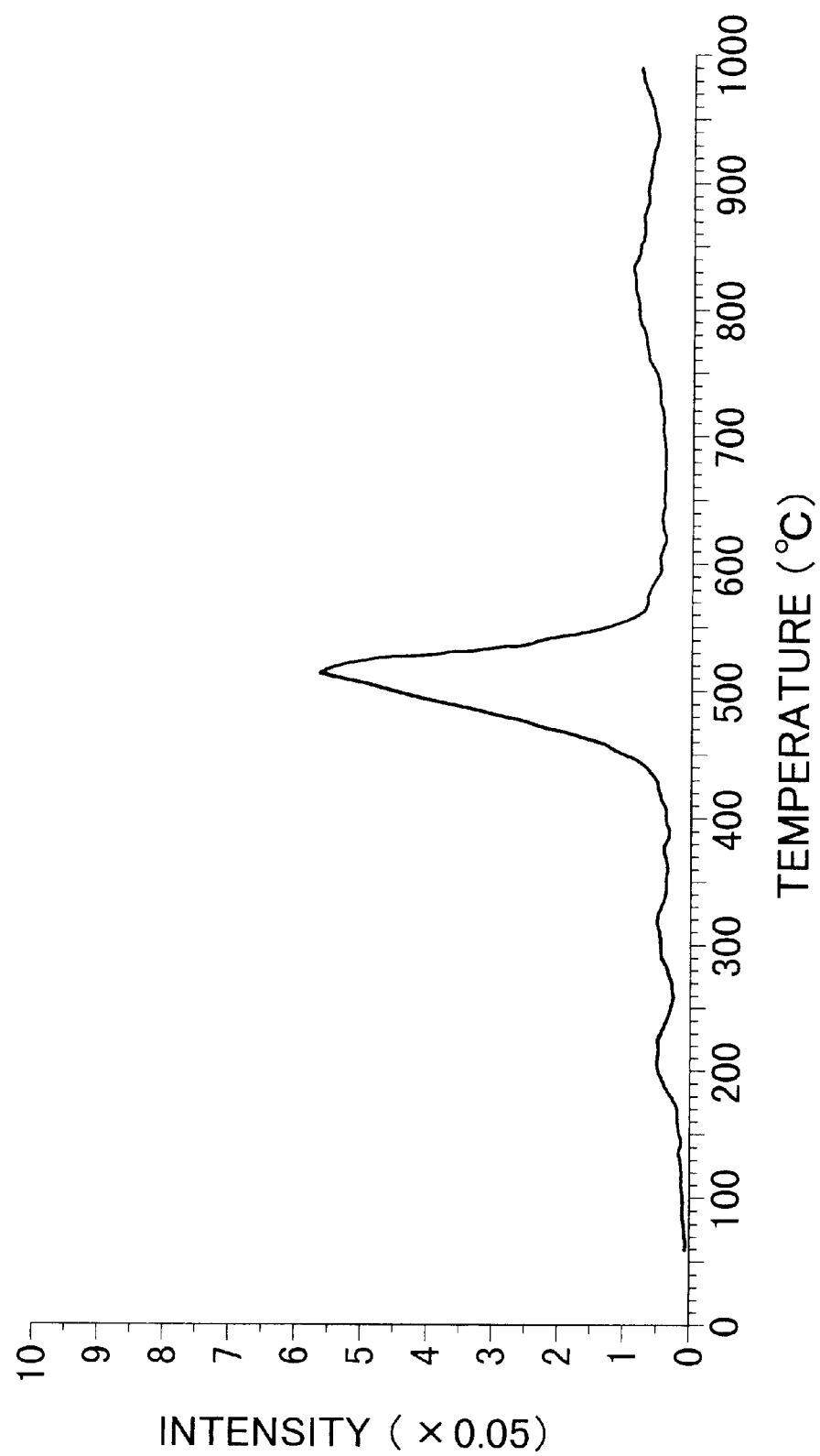
FIG. 19 is a graph of the results of monitoring the divalent ions of $SiH_2$ in elevated-temperature desorption analysis when a heat treatment for ceramic conversion was performed using the furnace in FIG. 18.
Figure 20:
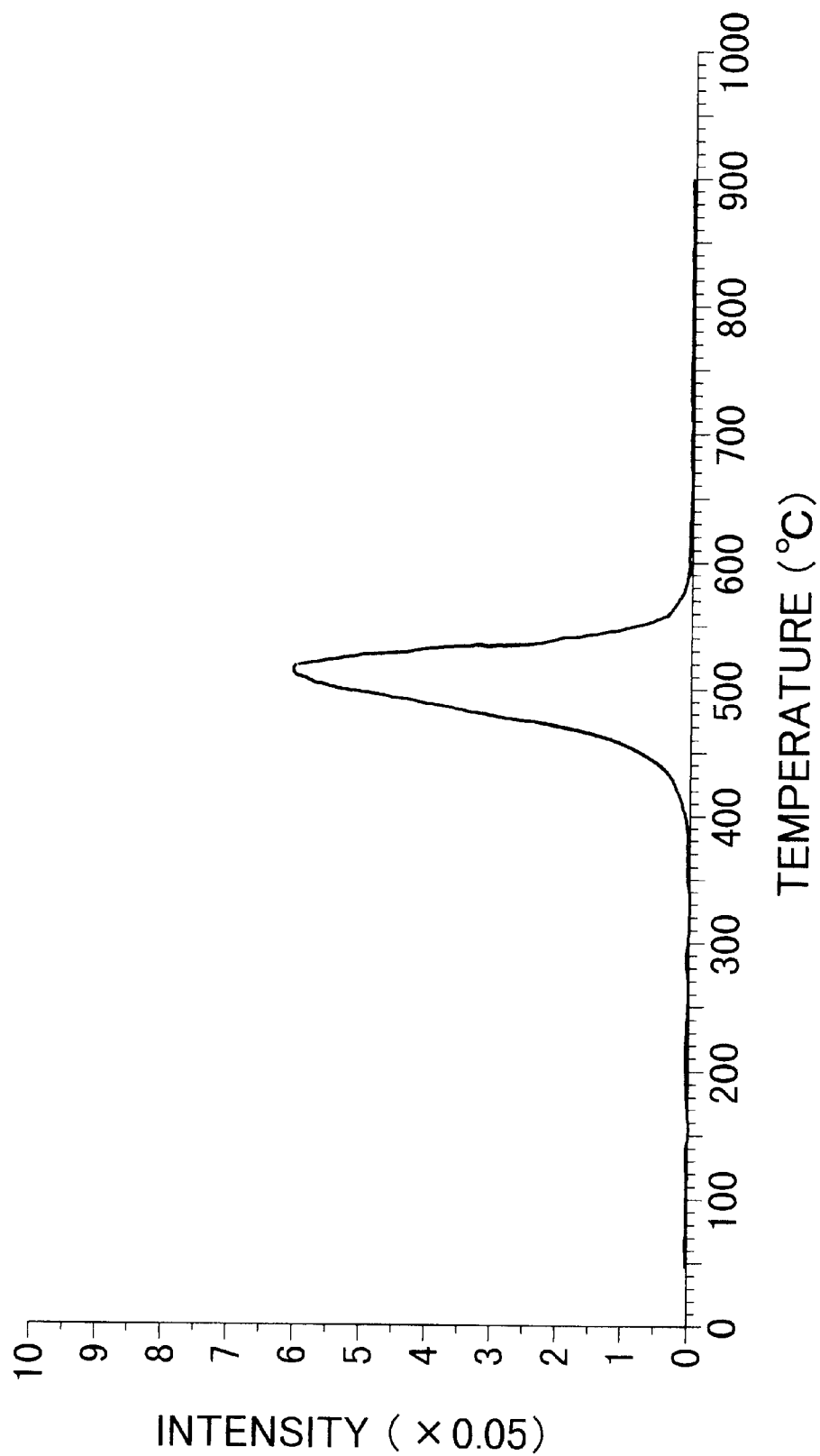
FIG. 20 is a graph of the results of monitoring the univalent ions of $SiH_2$ in elevated-temperature desorption analysis in the same case as in FIG. 19.

FIGS. 19 and 20 are graphs of the results of elevated-temperature desorption analysis when the heat treatment for ceramic conversion of a preceramic-phase silicon oxide film was performed using the furnace in FIG. 18. Fragment ions related to $SiH_4$ include ions of $SiH_4$, $SiH_3$, $SiH_2$, and $SiH$. Among these ions, those of $SiH_2$ display the strongest peak (main peak), so ions of $SiH_2$ were monitored. Ions of $SiH_2$ include both univalent and divalent ions, so these were monitored separately. FIG. 19 shows the results of monitoring divalent ions of $SiH_2$, while FIG. 20 shows the results of monitoring univalent ions of $SiH_2$.

It can be seen from FIGS. 19 and 20 that the $SiH_4$ [peak] begins to appear below 400° C., and the amount of $SiH_4$ generated increases sharply over 450° C.

Meanwhile, when the heat treatment for ceramic conversion of a preceramic-phase silicon oxide film was carried out under various conditions using the furnace in FIG. 18, the following tendencies were noted for the production of microscopic protrusions.

(1) More microscopic protrusions tend to be produced when the temperature of the heat treatment for ceramic conversion is higher. In particular, microscopic protrusions are always produced at temperatures over 400° C.

(2) More microscopic protrusions tend to be produced when the $N_2$ flux is smaller. When the $N_2$ flux is increased from 5.0 L/min to 20 L/min, there is a clear decrease in the number of microscopic protrusions produced.

(3) More microscopic protrusions tend to be produced when a greater number of wafers are loaded. There is an unmistakable difference in the number of microscopic protrusions produced when 1 and 50 wafers were loaded.

(4) When a silicon wafer on whose surface a preceramic-phase silicon oxide film has been formed is put into a furnace and subjected to a heat treatment for ceramic conversion along with a bare silicon wafer on whose surface nothing at all has been formed, there is much more foreign matter on the wafer surface than when only the bare silicon wafer is put into the furnace and subjected to the same heat treatment.

The above tendency in (4) is based on the results of the following experiment. 47 silicon wafers on whose surfaces had been formed preceramic-phase silicon oxide films were put into a furnace and subjected to a heat treatment for ceramic conversion together with three bare silicon wafers. The heat treatment conditions here were such that the temperature was 400° C., the duration was 60 minutes, and the feed gas was $O_2$ plus $N_2$ ($N_2$ flux of 5.0 L/min). After this, the number of foreign bodies on the three bare silicon wafers were counted, and this total number of foreign bodies was multiplied by ⅓ to determine a first average number of foreign bodies. Meanwhile, 50 bare silicon wafers alone were put into a furnace and subjected to a heat treatment under the same conditions as above, after which the number of foreign bodies on these 50 bare silicon wafers was counted, and this total number of foreign bodies was multiplied by ¹⁄₅₀ to determine a second average number of foreign bodies. A comparison of the first and second average numbers of foreign bodies revealed that the first average number of foreign bodies was much greater.

The inventors believe the mechanism by which the microscopic protrusions are produced is as follows. The fact of the above-mentioned (4) indicates that more particles are produced in the furnace if a preceramic-phase silicon oxide film is heat treated in the furnace. Meanwhile, when a preceramic-phase silicon oxide film is heat treated in a furnace, $SiH_4$ is generated from the above-mentioned silicon oxide film, as shown in FIGS. 19 and 20. The $SiH_4$ thus generated reacts with the $O_2$ present in the furnace on the order of a few tens of parts per million, and this produces $SiO_2$ particles. The reason the microscopic protrusions increase in number in proportion to the temperature, as discussed in (1) above, is that a larger amount of $SiH_4$ is produced when the temperature is higher. The reason there is a decrease in the number of microscopic protrusions when the $N_2$ flux is increased, as discussed in (2) above, is that the production of $SiO_2$ particles is suppressed because of a reduction in the amount of $O_2$, and at the same time there is an increase in the effect whereby the $SiO_2$ particles floating in the furnace are discharged to outside the furnace. The reason the microscopic protrusions increase in number in proportion to the number of wafers loaded, as discussed in (3) above, is that there is an increase in the total amount of $SiH_4$ produced. When the above results are taken into consideration as a group, the production of microscopic protrusions can be attributed to the fact that the $SiH_4$ produced from the silicon oxide film reacts with the $O_2$ in the furnace and becomes $SiO_2$, these $SiO_2$ particles float inside the furnace, and part of them fall onto and adhere to the wafer surfaces and become nuclei for the production of microscopic protrusion.

In view of this, one possible way to prevent the production of microscopic protrusions would be to reduce the amount of $SiO_2$ particles floating in the furnace. No $SiO_2$ particles are produced if the ceramic conversion heat treatment is carried out in an $N_2$ atmosphere that completely blocks off the $O_2$. However, since ceramic conversion will not proceed in an atmosphere in which no oxygen is present, there must be a tiny amount of $O_2$ in the furnace. Therefore, the production of $SiO_2$ particles is unavoidable in the performance of ceramic conversion.

Even though the production of $SiO_2$ particles cannot be avoided, it is possible to keep the $SiO_2$ particles that are produced from adhering to the wafers. The following methods (a) through (c) are considered potential ways to achieve this goal.

(a) If the furnace allows 50 wafers to be loaded, then increase the spacing between wafers by taking out every other wafer or more and thereby reducing the number of wafers being treated.

(b) Increase the volume of the furnace so that 50 wafers can be loaded even when the wafer spacing is increased.

(c) Increase the flux of the $N_2$ flowing through the furnace.

The above measures (a) and (b) involve enhancing the exhaust efficiency by raising the furnace volume per loaded wafer, whereas the above measure (c) involves enhancing the exhaust efficiency by increasing the $N_2$ flux. Problems, however, are that with measure (a) there is a drop in treatment capacity (throughput), with measure (b) the furnace becomes larger, and with measure (c) there is a decrease in uniformity of the temperature distribution between wafers. In addition, these measures do not avoid the floating of the $SiO_2$ particles in the vicinity of the wafers, so while they are beneficial in terms of the process margin, they are not fundamental solutions.

Figure 1:
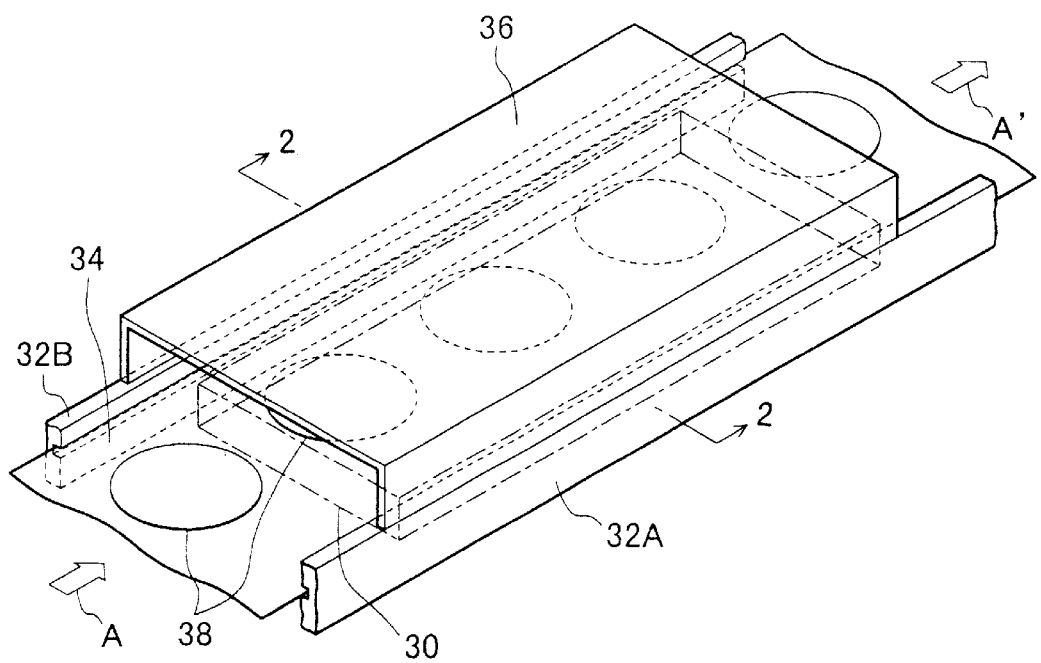
FIG. 1 is a perspective view of the heating apparatus used in the implementation of the present invention.
Figure 2:
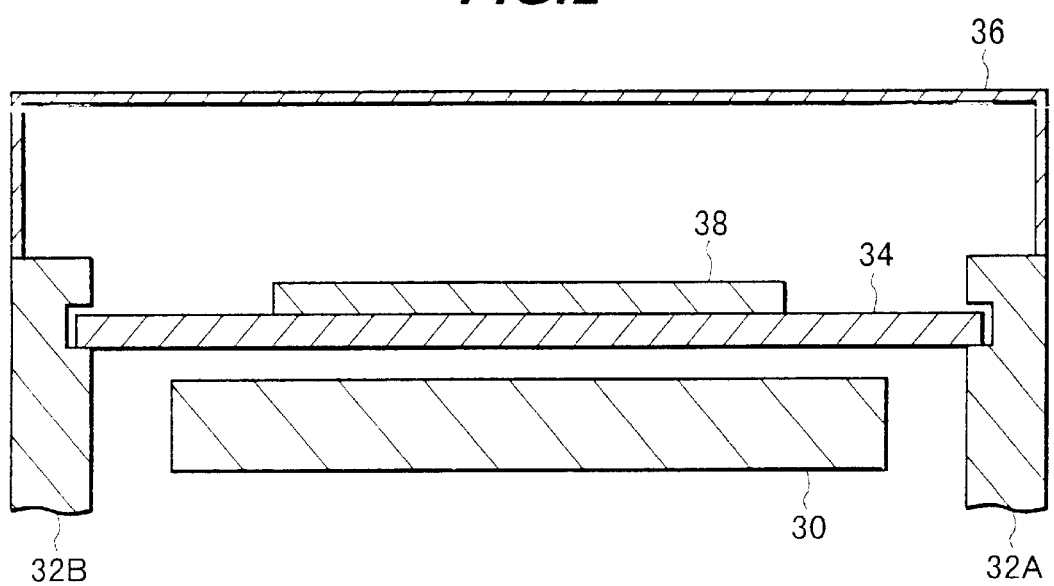
FIG. 2 is a cross section along the X–X' line in FIG. 1.

FIG. 1 shows an example of the hot-plate type of heating apparatus used in the practical examples. FIG. 2 is a cross section along the X–X' line in FIG. 1.

With the heating apparatus shown in FIGS. 1 and 2, a heat-generating block 30 which houses nichrome wires or another such heater is supported more or less horizontally by a support (not shown). Guide rails 32A and 32B for guiding the travel of a conveyor belt 34 and made of stainless steel are provided to both sides of the heat-generating block 30 such that they extend in parallel. The conveyor belt 34, which is made of SiC, moves along the guide rails.

Figure 3:
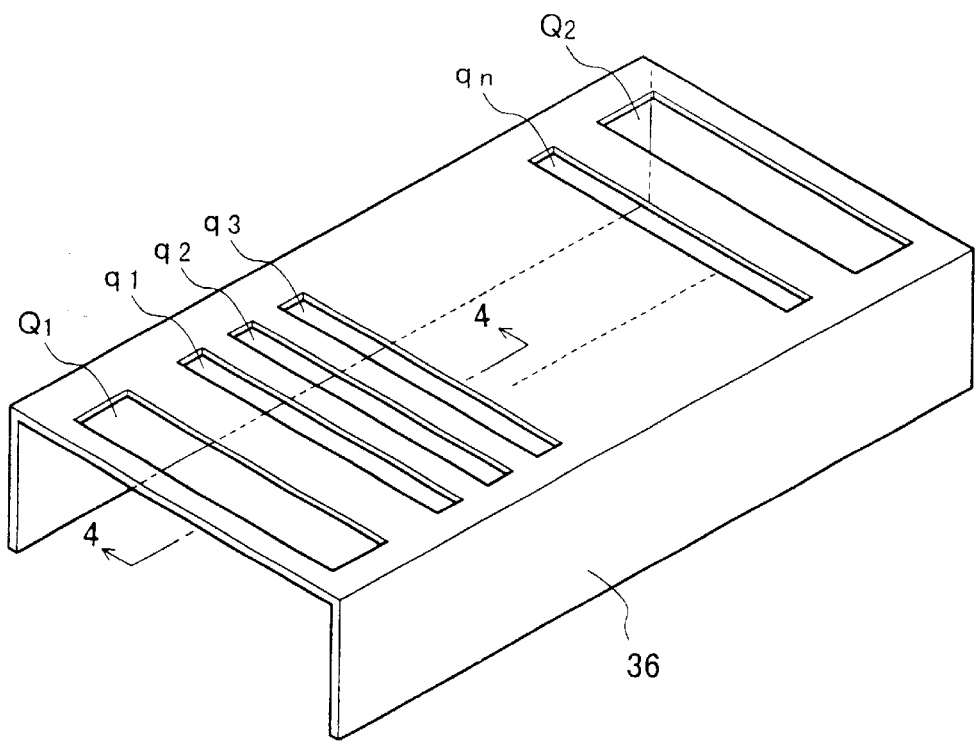
FIG. 3 is a perspective view of an example of a cover member that allows an inert gas to be blown at the wafers.

A cover member 36 made of stainless steel is provided such that it straddles the guide rails 32A and 32B and covers the heat-generating block 30. The cover member 36 is provided with gas blow holes $Q_1$, $Q_2$, $q_1$, ... $q_n$, for blowing an inert gas such as $N_2$ as shown in FIG. 3 as needed. $Q_1$, $Q_2$, $q_1$, ... $q_n$ are all slender slit-shaped holes formed in the direction perpendicular to the direction in which the conveyor belt 34 moves (the direction indicated by the arrows A and A'), with $Q_1$ and $Q_2$ being larger is size than $q_1$, ... $q_n$.

Figure 4:
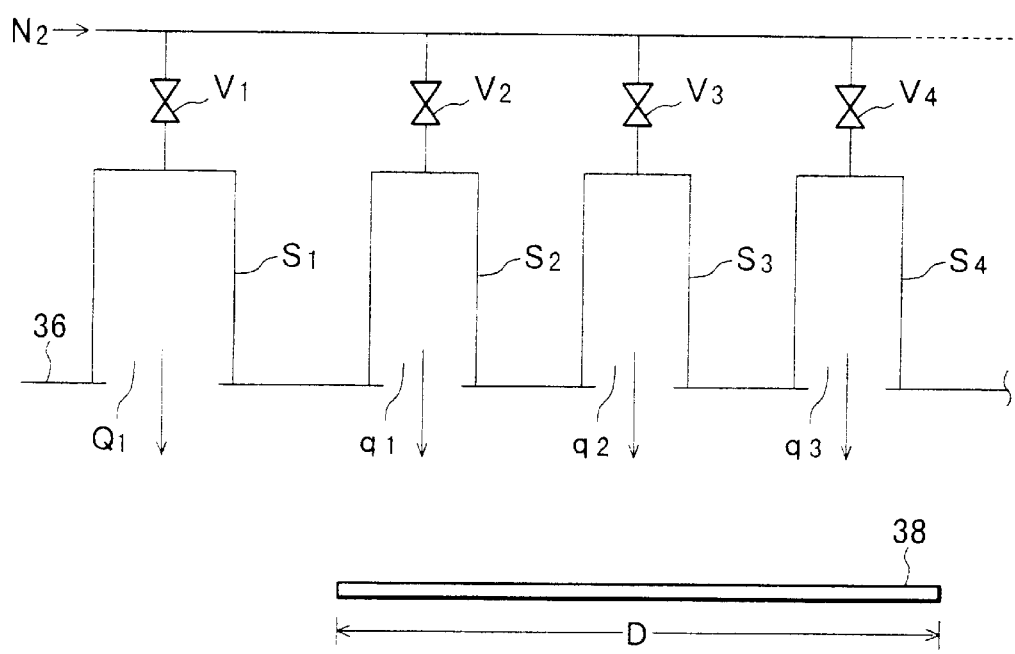
FIG. 4 is a cross section along the Y–Y' line in FIG. 3, and illustrates how the inert gas is blown at the wafers.
Figure 5:
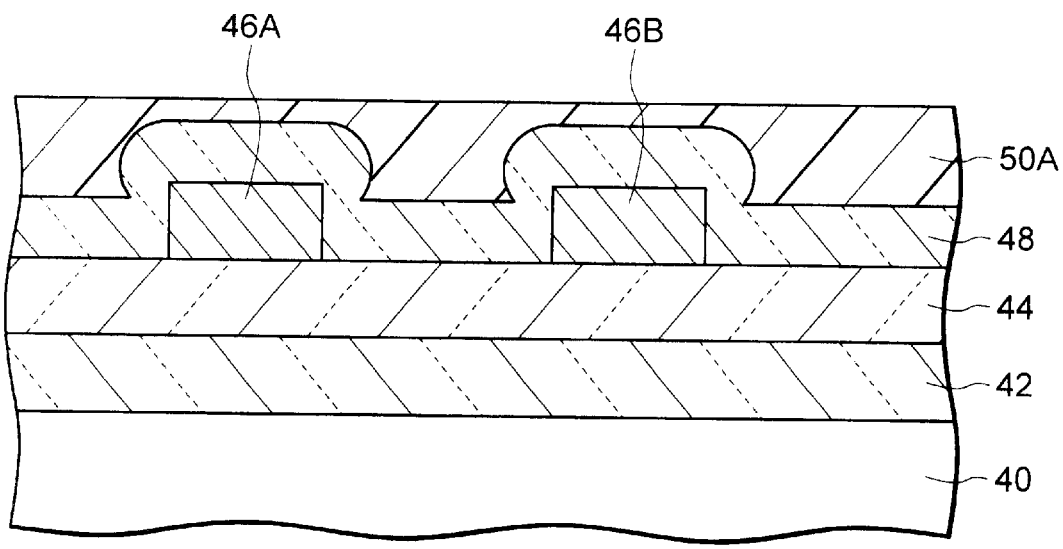
FIG. 5 is a cross section of a substrate illustrating the resin film formation steps in the multilevel wiring formation method pertaining to an embodiment of the present invention.
Figure 6:
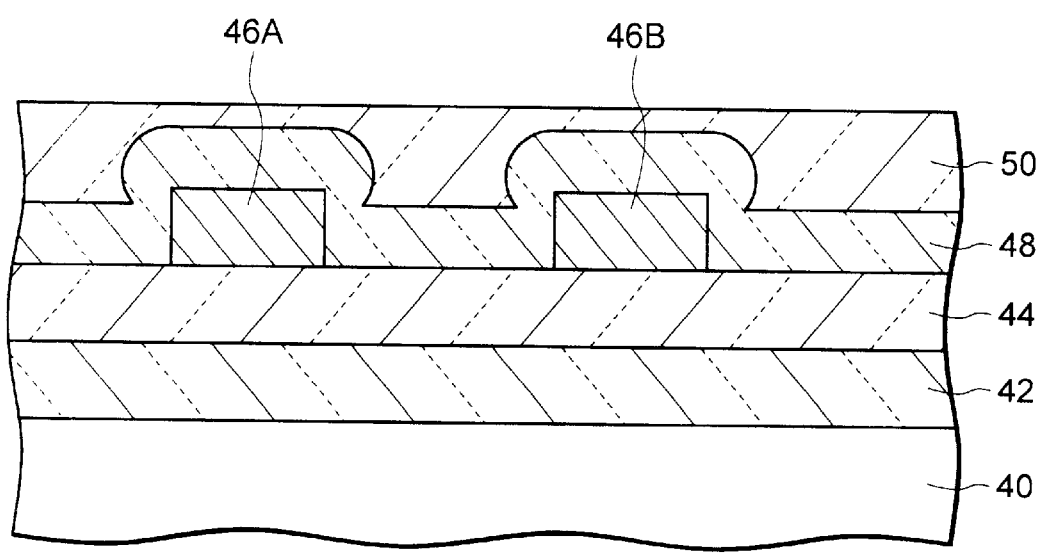
FIG. 6 is a cross section of the substrate illustrating the preceramic conversion step and ceramic conversion step following the step in FIG. 5.
Figure 7:
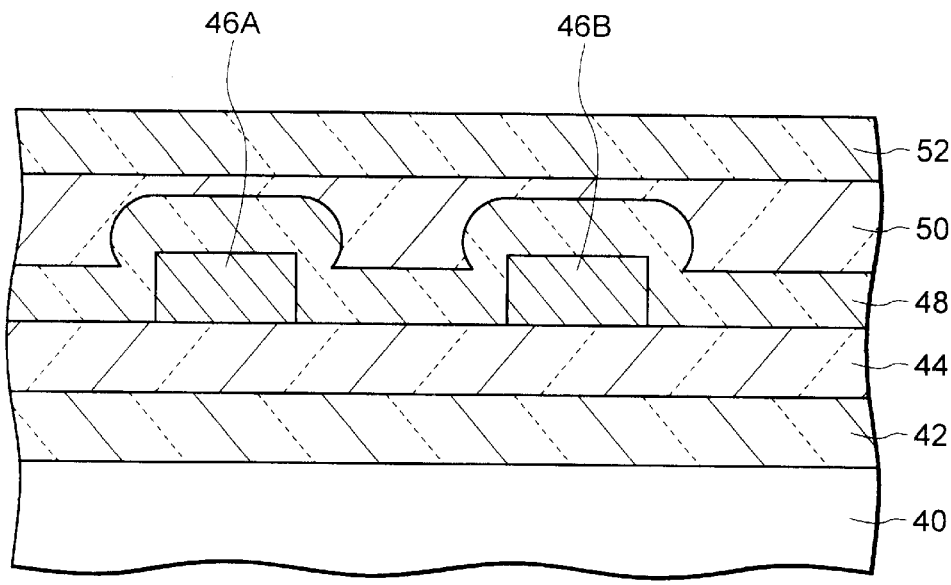
FIG. 7 is a cross section of the substrate illustrating insulation film formation step following the steps in FIG. 6.
Figure 8:
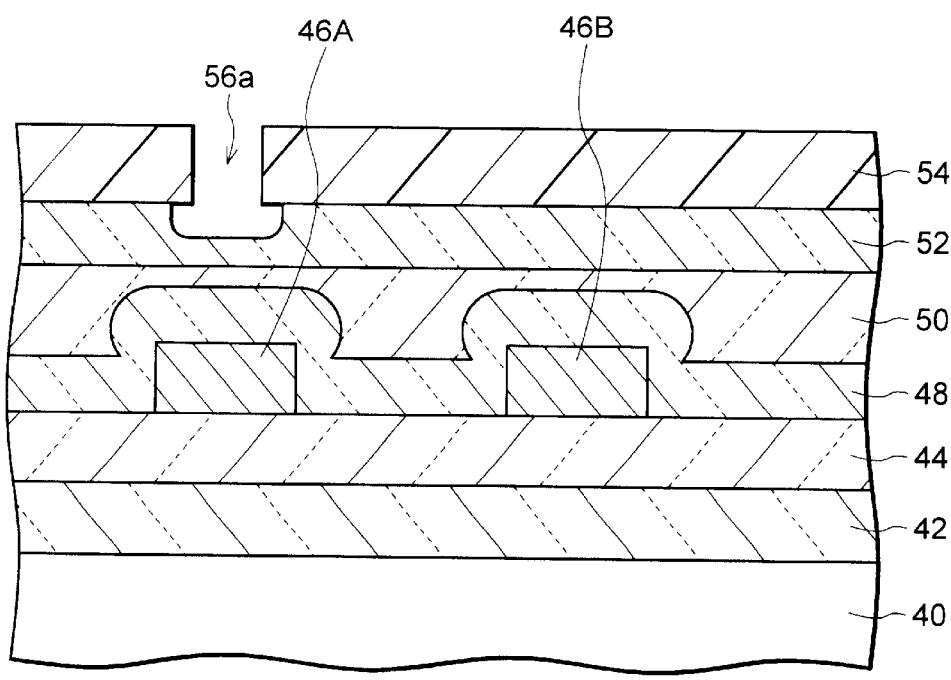
FIG. 8 is a cross section of the substrate illustrating the wet etching step following the step in FIG. 7.
Figure 9:
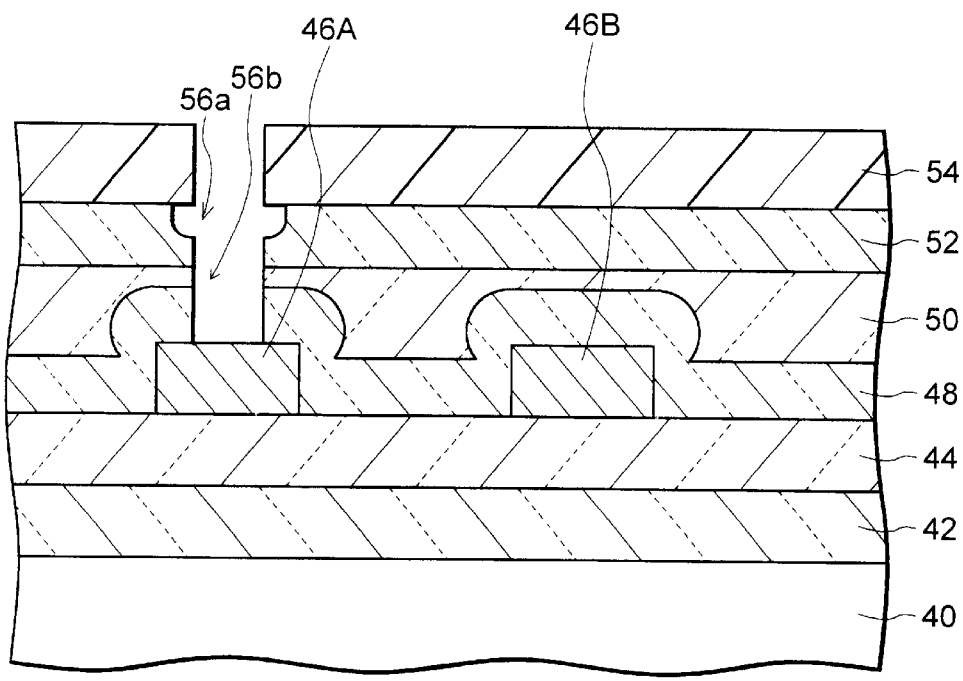
FIG. 9 is a cross section of the substrate illustrating the dry etching step following the step in FIG. 8.
Figure 10:
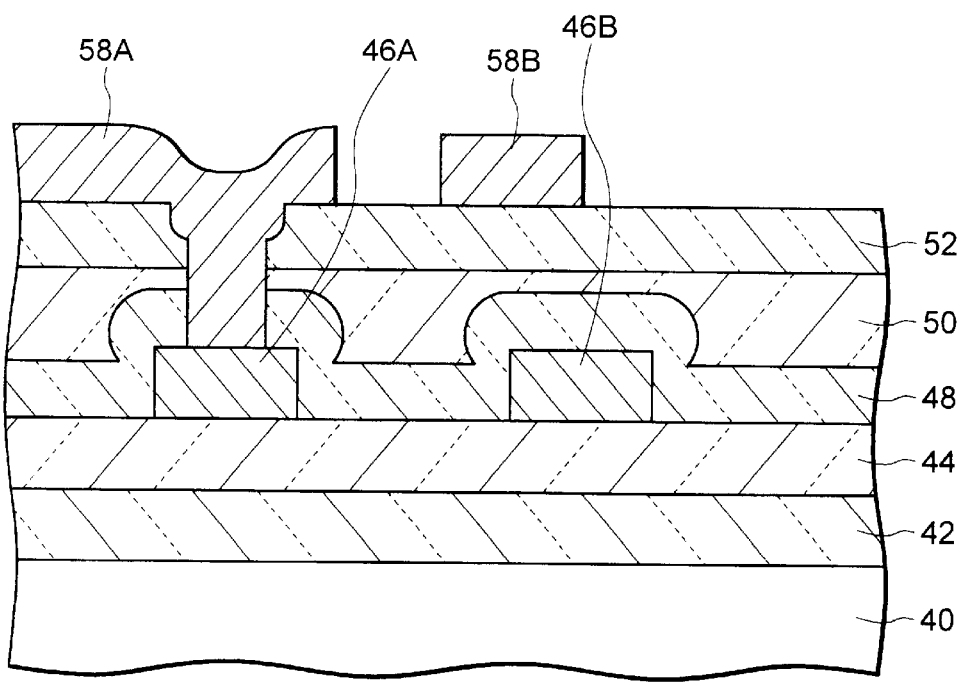
FIG. 10 is a cross section of the substrate illustrating the wiring formation step following the step in FIG. 9.
Figure 11:
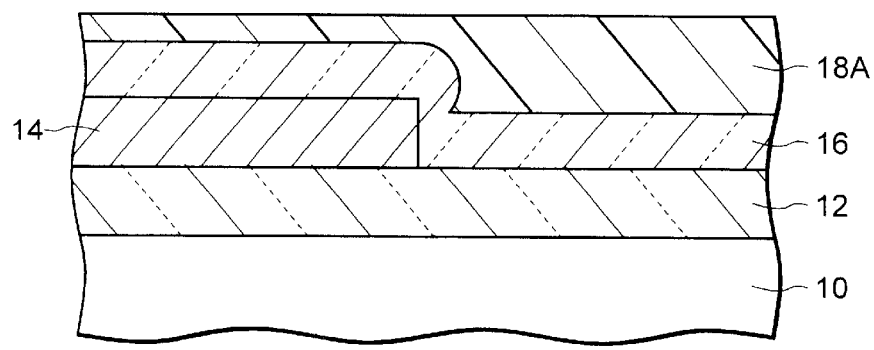
FIG. 11 is a cross section of a substrate illustrating the resin film formation step in a conventional multilevel wiring formation method.

FIG. 4 is a cross section along the Y–Y' line in FIG. 3. Gas feed ports $S_1$ through $S_4$ are connected to the gas blow holes $Q_1$ and $q_1$ through $q_3$, respectively. $N_2$ gas, for example, is fed through gas valves $V_1$ through $V_4$ to the gas feed ports $S_1$ through $S_4$. This gas feed system is also provided to the other gas blow holes $q_4$ through $q_n$ and $Q_2$, but for the sake of simplicity these are not depicted in the figure.

During the heating treatment, the conveyor belt 34 moves at a specific speed in the direction of the arrows A and A'. Wafers 38 to be treated, such as semiconductor substrates (discussed below), are loaded one at a time onto the conveyor belt 34 by a wafer loader (not shown). A heating space through which the air can pass freely is formed between the heat-generating block 30 and the cover member 36, and a heat treatment is carried out for each wafer by successively passing the plurality of treatment wafers 38 on the conveyor belt 34 through the heating space as the conveyor belt 34 moves along. At this point, $N_2$ or another inert gas can be blown through the gas blow holes $Q_1$, $q_1$ through $q_n$, and $Q_2$ as shown in FIGS. 3 and 4. FIG. 4 shows the relative positional relationships between the gas blow holes $q_1$ through $q_3$ and the wafer 38. As an example, the diameter D of the wafer 38 is approximately 150 mm.

The throughput is increased if a plurality of wafers 38 are successively passed through the heating space. For instance, if the treatment time for one wafer is ten minutes, then the treatment time for one lot can be greatly shortened from the 250 minutes (10 minutes per piece, (25 pieces) it would otherwise take.

FIGS. 5 to 10 illustrate a multilevel wiring formation method pertaining to an embodiment of the present invention. Steps F5 through F10 corresponding to these respective figures will be described in order.

F5: An insulation film 44 composed of BPSG (borophosphosilicate glass) with a thickness of 750 nm is formed by atmospheric pressure (1 atm, normal pressure) CVD or another such method on the surface of an insulation film 42 of silicon oxide or the like that covers the surface of a semiconductor substrate 40 of silicon or the like, and the insulation film 44 is subjected to a lamp annealing treatment for the sake of densification. The formation of the insulation film 44 was carried out under the following conditions as one example.

Substrate temperature: 400° C.
Pressure: 1 atm

Raw material gas: $SiH_4$(46.25 sccm)+$PH_3$(8.75 sccm)+$B_2H_6$(7.5 sccm)+$O_2$(7000 sccm)+$N_2$(50000 sccm).

The lamp annealing treatment was carried out under the following conditions, for example.

Substrate temperature: 850° C.
Temperature elevation time up to 850° C.: 10 seconds
Time maintained at 850° C.: 10 seconds.

Next, a wiring material is applied by sputtering or another such method to the top surface of the substrate, and this applied layer is subjected to a selective dry etching treatment to form wiring layers 46A and 46B. As an example of the wiring material, a Ti layer (20 nm), a TiON layer (100 nm), an Al—Si—Cu layer (400 nm), and a TiN layer (40 nm) were applied by sputtering from the bottom up. The dry etching treatment was carried out under the following conditions as one example.

Etching gas: $Cl_2$(30 sccm)+$BCl_3$(30 sccm)
Pressure inside etching chamber: 10 mTorr.

Next, an insulation film 48 composed of silicon oxide ($SiO_2$) with a thickness of 300 nm was formed by plasma enhanced CVD over the insulation film 44 such that the wiring layers 46A and 46B were covered. The formation of the insulation film 48 was carried out under the following conditions as one example.

Substrate temperature: 400° C.
Raw material gas: $SiH_4$(240 sccm)+$N_2O$(5000 sccm)+$N_2$ (2800 sccm)
Pressure inside reaction chamber: 2.2 Torr.

Next, a hydrogen silsesquioxane resin film 50A is formed flat such that the insulation film 48 is covered. The resin film 50A was formed, for example, by dissolving hydrogen silsesquloxane resin in MIBK and using a spin coater to apply the resulting solution in a thickness of 500 nm. The thickness of the resin film 50A can be selected as desired from a range of 300 to 600 nm.

F6: The resin film 50A is converted into a preceramic-phase silicon oxide film 50 by subjecting the resin film 50A to a heat treatment in an inert gas. In this heat treatment, for example, $N_2$ gas is used as the inert gas, and the heating lasts for 1 to 60 minutes at a temperature of at least 150° C. but less than 350° C. As an example, a heat treatment was conducted using a hot plate in an $N_2$ gas atmosphere for 1 minute at 150° C. and 1 minute at 300° C. The hot plate was not the movable type shown in FIGS. 1 through 4, but was instead an ordinary stationary type, the wafers were placed one at a time on the hot plate, and the heat treatment was carried out in an open space while the $N_2$ gas was supplied.

The heating temperature should be no higher than 300° C. so that the fluidity of the hydrogen silsesquioxane resin can be maintained and the production of microscopic protrusions can be effectively suppressed.

Next, a heat treatment for converting the preceramic-phase silicon oxide film 50 into a ceramic-phase silicon oxide film is carried out at a temperature of 400 to 450° C. in an oxidizing atmosphere using the hot plate type of heating apparatus discussed in reference to FIGS. 1 through 4. In this case, air is used as the oxidizing atmosphere. In order to check the effect of this heat treatment, heat treatments in which nitrogen blowing was added to the oxidizing atmosphere using a stationary hot plate were carried out under different conditions for six groups of samples. The conditions of the heat treatments applied to the various six sample groups were as shown in the following Table 1 (conditions 1 through 6). Under all of the conditions 1 through 6, none of the production of microscopic protrusions seen in the past was observed for the ceramic-phase silicon oxide films 50 obtained as a result of heat treatment.

TABLE 1

|  | Conditions 1 | Conditions 2 | Conditions 3 | Conditions 4 | Conditions 5 | Conditions 6 |
|---|---|---|---|---|---|---|
| Heat treatment temp(° C.) | 400 | 400 | 400 | 420 | 450 | 450 |
| Heat treatment time (min) | 6 | 6 | 12 | 6 | 6 | 10 |
| $N_2$ flux (L/min) | 31.2 | 16.2 | 31.2 | 31.2 | 31.2 | none |
| Si—H residual rate (%) | 57 | 57 | 24 | 42 | 23 | 61 |

In table 1, "Si—H residual rate" indicates the variation in the Si—H group content of the silicon oxide resin before and after the heat treatment for ceramic conversion. The smaller the value, the more the ceramic conversion has progressed.

The fact that no microscopic protrusions were produced on the ceramic-phase silicon oxide film 50 is attributed to the following by the inventors. Specifically, the reason no microscopic protrusions were produced is that even if $SiO_2$ particles are produced by a reaction between the $O_2$ in the air and the $SiH_4$ generated from the silicon oxide film during heating with the open heating apparatus, these $SiO_2$ particles are efficiently kept away from the wafer (semiconductor substrate) top and the nearby areas by the countercurrent of heated air and other factors. Also, as shown in Table 1, since no microscopic protrusions were produced even under conditions 6, in which there was no $N_2$ blowing, there is the possibility that heating within the air is causing the oxidation of the surface of the silicon oxide film to progress and is thereby suppressing the generation of $SiH_4$. Furthermore, it seems that the $SiO_2$ particles are kept away even more efficiently by the blowing of the $N_2$ gas in the case of conditions 1 through 5 (with $N_2$ gas blowing) than in the case of conditions 6 (no $N_2$ gas blowing).

F7: An insulation film 52 composed of silicon oxide ($SiO_2$) with a thickness of 500 nm is formed by plasma enhanced CVD such that the ceramic-phase silicon oxide film 50 is covered. The formation of the insulation film 52 was carried out under the following conditions as one example.

Substrate temperature: 400° C.

Raw material gas: $SiH_4$(240 sccm)+$N_2O$(5000 sccm)+$N_2$ (2800 sccm)

Pressure inside reaction chamber: 2.2 Torr.

A silicon oxide film formed by the following method A or B may instead be used as the insulation film 52.

A: Plasma enhanced CVD method in which tetraethyl orthosilicate (TEOS; $Si(OC_2H_5)_4$) and $O_2$ are used as the raw materials: Film formation in this method was carried out under the following conditions, a s one example.

Substrate temperature: 400° C.

Raw material gas: TEOS (1.8 cc/mm (supplied as a liquid)+$O_2$(8000 sccm)

Pressure inside reaction chamber: 2.2 Torr.

B: Sputtering method in which $SiO_2$ is used as the target: Film formation in this method was carried out under the following conditions, as one example.

Apparatus used: RF sputtering apparatus (13.56 MHz)

Substrate temperature: 200° C.

Target: $SiO_2$

Pressure inside reaction chamber: 6 mTorr

Atmosphere inside reaction chamber: mixed gas of argon and oxygen

RF power: 1 kW.

F8: A resist layer 54 having a hole corresponding to the desired connecting hole is formed on the insulation film 52 by a known photolithography process, after which a shallow connecting hole 56a is formed by selective wet etching (isotropic etching) using the resist layer 54 as a mask. The connecting hole 56a serves to enhance the step coverage of the wiring by moderating the step at the opening edge of the deep connecting hole 56b shown in FIG. 9.

In the wet etching treatment, a 10:1 mixture of an NH4F aqueous solution and HF was used as the etching solution. In the steps up to FIG. 6, no microscopic protrusions were formed on the silicon oxide film 50, and no convex components corresponding to the microscopic protrusions were formed on the insulation film 52, so partially enhanced etching of the silicon oxide film 50 did not occur, as was the case in the past.

F9: A connecting hole 56b that extends from the connecting hole 56a to the wiring layer 46A is formed by selective dry etching (anisotropic etching) in which the resist layer 54 serves as a mask. Since there is no partial dissolution of the silicon oxide film 50, the connecting hole 56b is formed in the proper shape, without having the concave component shown in FIG. 15.

F10: A wiring material is applied by sputtering or another such method to the top surface of the substrate, and this applied layer is patterned by selective dry etching, which forms wiring layers 58A and 58B over the insulation film 52. The wiring layer 58A is connected to the underlying wiring layer 46A via the connecting holes 56a and 56b. Al—Si—Cu (400 nm) was applied by sputtering as the wiring material. The dry etching treatment was conducted under the following conditions, as one example.

Etching gas: $Cl_2$(30 sccm)+$BCl_3$(30 sccm)

Pressure inside etching chamber: 10 mTorr.

Figure 16:
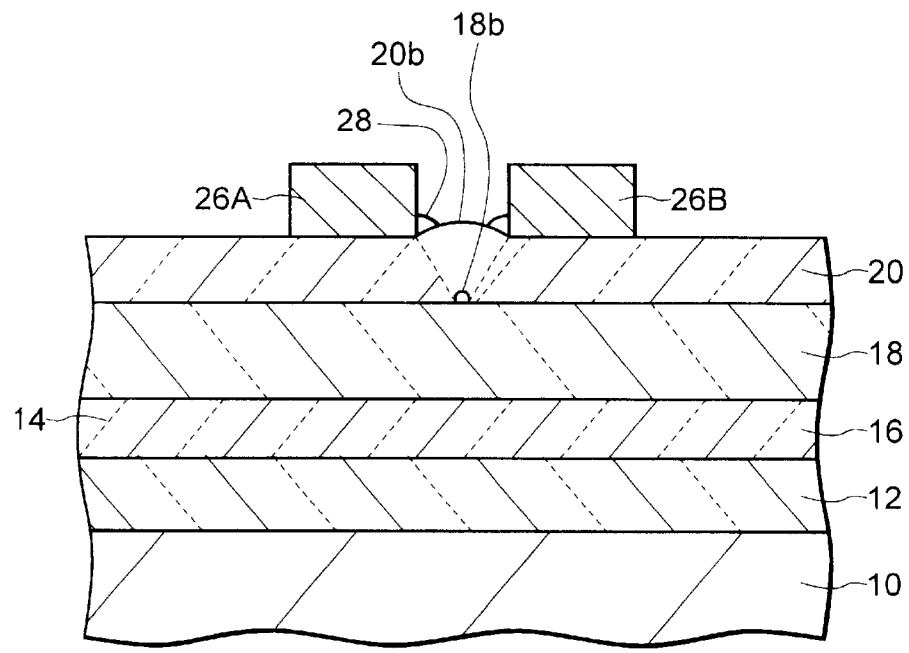
FIG. 16 is a cross section of the substrate illustrating how the wiring is formed near the convex component of the interlayer insulating film.
Figure 17:
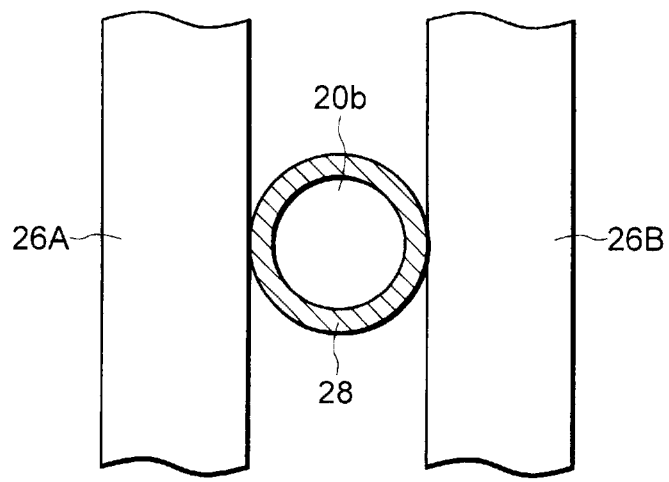
FIG. 17 is a top view of the wiring structure in FIG. 16.

Since the connecting holes 56a and 56b were formed in the proper shape, the wiring layer 58A is also formed with good step coverage. Also, even if the wiring layers 58A and 58B are positioned close to each other, since the convex component corresponding to a microscopic protrusion shown in FIGS. 16 and 17 is not formed, there is no short-circuiting between the wiring layers 58A and 58B due to etching residue of the wiring material.

The advantage of providing the insulation film 48 is that hillock generation from the wiring layers 46A and 46B can be suppressed. In some cases, the insulation film 48 can be omitted, and the above-mentioned hydrogen silsesquioxane resin film 50A can be formed by directly covering the insulation film 44 and the wiring layers 46A and 46B.

The insulation film 52 that is the uppermost layer in the interlayer insulating films between the wiring layers 46A and 46B and the wiring layers 58A and 58B should be one that satisfies conditions such as being resistant to cracking, having a low hydroscopicity, and being able to be formed at low temperature. An insulation film formed by a method in which the step coverage is not good, such as the above-mentioned plasma enhanced CVD or sputtering, satisfies the above-mentioned conditions, and is favorable for use as the insulation film 52.

With the above embodiment, no microscopic protrusions are produced on the surface of the ceramic-phase silicon oxide film 50 in the ceramic conversion step shown in FIG.

6, so flatness is improved and there is no deterioration of the connecting hole shape, or any wiring shorts.

Also, since the heat treatment for ceramic conversion is carried out in a heating space through which the air can freely pass, the oxygen concentration near the wafers stays constant, and no difference is seen in the quality of the ceramic-phase silicon oxide films from one heating apparatus to another. In contrast, when the ceramic conversion heat treatment was carried out in a furnace as shown in FIG. 18, since the residual oxygen concentration inside a furnace varies slightly from furnace to furnace, the quality of the ceramic-phase silicon oxide films also varied among furnaces. With the heating method pertaining to the above embodiment, reproducibility was also good when the heating conditions were fixed.

The present invention is not limited to the above embodiment, and can be implemented in a variety of modified configurations as well. For example, the following modifications are possible.

(1) The heating apparatus is not limited to a wafer movement type, and a type that holds the wafers in a stationary state during heating may also be used.

(2) The structure for blowing the inert gas at the wafers is not limited to one that blows from a cover member, and a structure that blows from a plurality of pipes may also be used.

(3) The inert gas blown at the wafers is not limited to $N_2$, and argon, helium, neon, or the like may also be used.

What is claimed is:

1. A method of fabricating a wiring structure comprising:
   a) providing a substrate having conductive regions and an overlying structure thereon;
   b) forming a hydrogen silsesquioxane resin film over said substrate:
   c) subjecting said hydrogen silsesquioxane resin film to a first heat treatment in an inert gas atmosphere to convert said hydrogen silsesquioxane resin film into a silicon oxide film in a preceramic phase; and
   d) subjecting said silicon oxide film to a second heat treatment in an ambient which is open to external atmosphere and through which external atmosphere can pass to convert the silicon oxide film of the preceramic phase to a silicon oxide of a ceramic phase.

2. A method according to claim 1, further comprising the steps of:
   e) forming a connecting hole through the silicon oxide film of the ceramic phase; and
   f) forming a wiring layer in the connecting hole so as to make an electrical contact between the wiring layer and the conductive region.

3. A method according to claim 2, further comprising the step of forming a first and a second interlayer insulating film covering the overlying structure, wherein the connecting hole is provided through the first interlayer insulating film, the second interlayer insulating film, and the silicon oxide film of the ceramic phase.

4. A method according to claim 1, wherein the first heat treatment is performed at a temperature in a range of 150° C. to 350° C.

5. A method according to claim 4, wherein the first heat treatment is performed at a temperature of 300° C. or less.

6. A method according to claim 1, wherein the second heat treatment is performed at a temperature in a range of 400° C. to 450° C.

7. A method according to claim 1, wherein the first heat treatment is performed in an inert gas atmosphere.

8. A method according to claim 7, wherein the inert gas atmosphere is a nitrogen gas atmosphere.

9. A method according to claim 1, wherein the overlying structure includes a wiring layer formed over the substrate and a first interlayer insulating film formed over the wiring layer.

10. A method according to claim 1, further comprising the step of:
    d-1) after the step d), forming a second interlayer insulating layer over the silicon oxide film.

11. A method according to claim 10, wherein the second interlayer insulating layer is made by using one of a method of forming a phosphosilicate glass film or a borophosphosilicate glass film by atmospheric pressure chemical vapor deposition (CVD).

12. A method of fabricating a wiring structure comprising the steps of:
    a) providing a substrate having conductive regions and an overlying structure thereon;
    b) forming a hydrogen silsesquioxane resin film over the substrate;
    c) subjecting said hydrogen silsesquioxane resin film to a first heat treatment in an inert gas atmosphere to convert said hydrogen silsesquioxane resin film into a silicon oxide film in a preceramic phase;
    d) placing the substrate in a heating apparatus having an aperture which communicates with an open air atmosphere and through which external air can pass; and
    e) subjecting said silicon oxide film to a second heat treatment in the heating apparatus so as to form the silicon oxide film.

13. A method according to claim 12, further comprising the steps of:
    f) forming a connecting hole through the silicon oxide film; and
    g) forming a wiring layer in the connecting hole so as to make an electrical contact between the wiring layer and the conductive region.

14. A method according to claim 13, further comprising the step of forming a first and a second interlayer insulating film covering the overlying structure, wherein the connecting hole is provided through the first interlayer insulating film, the second interlayer insulating film, and the silicon oxide film of the ceramic phase.

15. A method according to claim 12, wherein the first heat treatment is performed at a temperature in a range of 150° C. to 350° C.

16. A method according to claim 15, wherein the first heat treatment is performed at a temperature of 300° C. or less.

17. A method according to claim 12, wherein the second heat treatment is performed at a temperature in a range of 400° C. to 450° C.

18. A method according to claim 17, wherein the first heat treatment is performed in an inert gas atmosphere.

19. A method according to claim 18, wherein the inert gas atmosphere is a nitrogen gas atmosphere.

20. The method of claim 12, wherein said first and second heat treatments are carried out in such a manner that silicon oxide particle generated by the reaction of $SiH_4$ generated from said preceramic state silicon oxide film and oxygen are prevented from being deposited on said substrate.

21. The method of claim 12, wherein said second heat treatment is carried out while said substrate is moved through a heating apparatus by a conveyor.

22. A method of fabricating a wiring structure comprising the steps of:

a) providing a substrate having conductive regions and an overlying structure thereon;

b) forming a hydrogen silsesquioxane resin film over the substrate;

c) subjecting said hydrogen silsesquioxane resin film to a first heat treatment in an inert gas atmosphere to convert said hydrogen silsesquioxane resin film into a silicon oxide film in a preceramic phase;

d) placing the substrate in a heating apparatus having a first inlet which communicates with an open air atmosphere and through which external air can pass and having a second inlet for providing introduction of an inert gas; and e) subjecting said silicon oxide film to a second heat treatment in the heating apparatus while the inert gas is provided through the second inlet so as to form the silicon oxide film.

23. A method according to claim 22, further comprising the steps of:

f) forming a connecting hole through the silicon oxide film; and g) forming a wiring layer in the connecting hole so as to make an electrical contact between the wiring layer and the conductive region.

24. A method according to claim 23, further comprising the step of forming a first and a second interlayer insulating film covering the overlying structure, wherein the connecting hole is provided through the first interlayer insulating film, the second interlayer insulating film, and the silicon oxide film of the ceramic phase.

25. A method according to claim 22, wherein the first heat treatment is performed at a temperature in a range of 150° C. to 350° C.

26. A method according to claim 20, wherein the first heat treatment is performed at a temperature of 300° C. or less.

27. A method according to claim 22, wherein the second heat treatment is performed at a temperature in a range of 400° C. to 450° C.

28. A method according to claim 27, wherein the first heat treatment is performed in an inert gas atmosphere.

29. A method according to claim 28, wherein the inert gas atmosphere is a nitrogen gas atmosphere.

30. A method according to claim 22, wherein the second inlet includes plural slits to provide the inert gas.

31. A method according to claim 30, wherein the substrate is conveyed under the plural slits during the second heat treatment.

32. The method of claim 22, wherein said first and second heat treatments are carried out in such a manner that silicon oxide particle generated by the reaction of $SiH_4$ generated from said preceramic state silicon oxide film and oxygen are prevented from being deposited on said substrate.

33. The method of claim 22, wherein said second heat treatment is carried out while said substrate is moved through a heating apparatus by a conveyor.

34. A method of fabricating a wiring structure comprising:

a) providing a substrate having conductive regions and an overlying structure thereon;

b) forming a hydrogen silsesquioxane resin film over said substrate;

c) subjecting said hydrogen silsesquioxane resin film to a first heat treatment in an inert gas atmosphere to convert said hydrogen silsesquioxane resin film into a silicon oxide film in a preceramic phase; and d) subjecting said silicon oxide film to a second heat treatment in an ambient which is open to external atmosphere and through which external atmosphere can pass to convert the silicon oxide film of the preceramic phase to a silicon oxide of a ceramic phase, e) said first and second heat treatments being carried out in such a manner that silicon oxide particles generated by the reaction of $SiH_4$ generated from said preceramic state silicon oxide film and oxygen are prevented from being deposited on said substrate.

* * * * *